United States Patent [19]

Hayano

[11] Patent Number: 4,749,954
[45] Date of Patent: Jun. 7, 1988

[54] CURRENT SWITCH CAPABLE OF PRODUCING A STABLE OUTPUT OF A DESIRED LEVEL

[75] Inventor: Shin-ichiro Hayano, Tokyo, Japan
[73] Assignee: NEC Corporation, Tokyo, Japan
[21] Appl. No.: 60,858
[22] Filed: Jun. 12, 1987
[30] Foreign Application Priority Data Jun. 13, 1986 [JP] Japan .............................. 61-138836

[51] Int. Cl.[4] .............................................. H03F 3/45
[52] U.S. Cl. .................... 330/253; 307/356; 330/261
[58] Field of Search ............... 330/252, 253, 261, 69; 307/355, 356

[56] References Cited

FOREIGN PATENT DOCUMENTS 126320 10/1981 Japan .................................. 307/355

*Primary Examiner*—James B. Mullins
*Attorney, Agent, or Firm*—Leydig, Voit & Mayer

[57] ABSTRACT

A current switch is disclosed. The current switch comprises an arrangement for converting the difference between input signals fed to first and second input terminals into the difference between output signals from first and second output terminals; a power source for supplying a constant current to the converting arrangement; constant voltage means connected between a first output terminal of the converting arrangement and the power source; a first resistor, one end of which is connected to the power source; a second resistor, one end of which is connected to the other end of the first resistor and the other end of which is connected to the first output terminal of the converting arrangement; and a third resistor, one end of which is connected to the other end of the first resistor and the other end of which is connected to the second output terminal of the converting arrangement, wherein an output signal is taken out of the second output terminal.

2 Claims, 4 Drawing Sheets

CURRENT SWITCH CAPABLE OF PRODUCING A STABLE OUTPUT OF A DESIRED LEVEL

BACKGROUND OF THE INVENTION

The present invention relates to a current switch, and more particularly to a current switch with little fluctuation of the output level and permitting setting of the high level of the output as desired.

A current switch of the prior art, as will be described below in further detail, would consist of two differentially connected field effect transistors (FET's) and a diode or a resistor. Such a conventional current switch, however, involves the problem of unstable output voltage or of inability to provide a desired output voltage.

SUMMARY OF THE INVENTION

An object of the present invention, therefore, is to obviate this disadvantage of the conventional current switch and provide a current switch whose output voltage is stable and, moreover, can be set at any desired level.

According to the invention, there is provided a current switch comprising converting means having first and second input terminals and first and second output terminals and for converting the difference between input signals fed to said first and second input terminals into the difference between output signals from said first and second output terminals; a power source for supplying a constant current to the converting means; constant voltage means connected between a first output terminal of said converting means and said power source; a first resistor of which one end is connected to said power source; a second resistor of which one end is connected to the other end of said first resistor and the other end is connected to said first output terminal of said converting means; and a third resistor of which one end is connected to the other end of said first resistor and the other end is connected to a second output terminal of said converting means, wherein an output signal is taken out of said second output terminal.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENT

To facilitate understanding of the present invention, current switches of the prior art will be described first.

Figure 1:
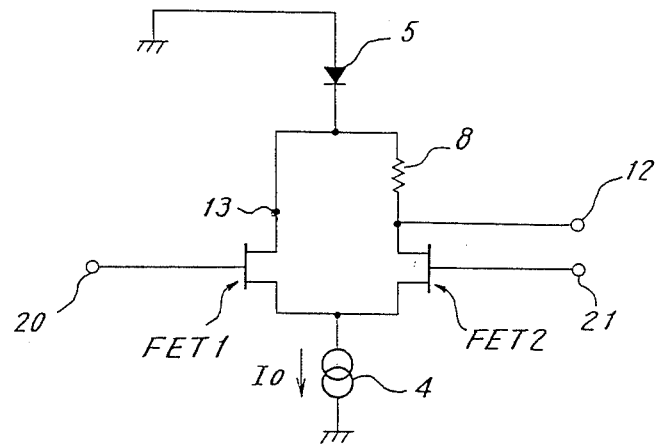
FIGS. 1 and 3 are circuit diagrams illustrating conventional current switches.
Figure 2:
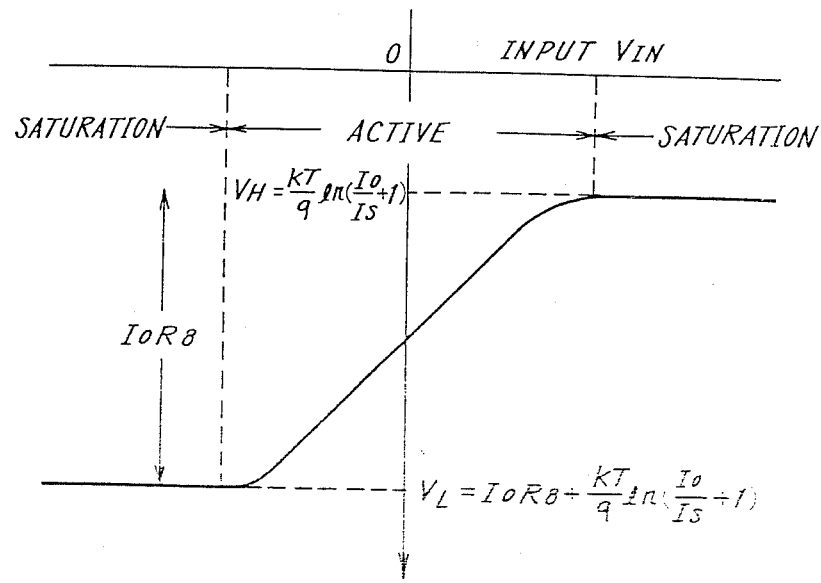
FIG. 2 is a diagram illustrating the input-output relationship of a current switch.

FIG. 1 illustrates a first specific example of a conventional current switch. FIG. 2 is a diagram illustrating the input/output characteristic of the current switch shown in FIG. 1. In FIG. 1, two FET's 1 and 2 are differentially connected. To the gates of the FET's 1 and 2 are supplied input signals via input terminals 20 and 21, respectively, and between output terminals 12 and 13 emerges a signal corresponding to the difference between the input signals. However, its output signal as a current switch is taken out of the output terminal 12.

Referring to FIG. 1, $V_{IN}$ is defined as the remainder of subtracting the voltage at the input terminal 21 from that at the input terminal 20. First, supposing a large negative value for the input voltage $V_{IN}$, the FET 1 is cut off and the FET 2, turned on. A current $I_0$ flowing through the whole current switch is constant and determined by a constant current source 4. Since the current $I_0$ wholly flows through a diode 5, a resistor 8 and the FET 2 which is on, it manifests a saturation characteristic as shown in FIG. 2. The output voltage at this time, represented by $V_L$, is:

$$V_L = -I_0 R_8 - \frac{kT}{q} \ln\{(I_0/I_S) + 1\} \quad (1)$$

where $I_S$ is a constant determined by the structure of the diode 5; k, Boltzman's constant; q, the charge of an electron; T, temperature; and $R_8$, the resistance of the resistor 8.

Next, supposing that the input voltage $V_{IN}$ is in the proximity of 0 (V), the current $I_0$ flows into both the FET's 1 and 2. The current flowing to the FET 1 decreases with the rise of the input $V_{IN}$ and conversely, that flowing to the FET 2 increases, so that the current switch is activated. Thus, the output voltage increases in proportion to the input voltage $V_{IN}$ to serve as an amplifier.

Where the input voltage $V_{IN}$ has a high positive value, the FET 2 will be cut off, and the FET 1 will be on. The current $I_0$ will wholly flow through the diode 5 and the FET 1 which is on, and manifest a saturation characteristic as shown in FIG. 2. The output voltage at this time, represented by $V_H$, will be:

$$V_H = -\frac{kT}{q} \ln\{(I_0/I_S) + 1\} \quad (2)$$

The output voltage $V_H$, since it has a logarithmic characteristic with respect to the current $I_0$, will hardly vary with the fluctuation of the current $I_0$.

Figure 3:
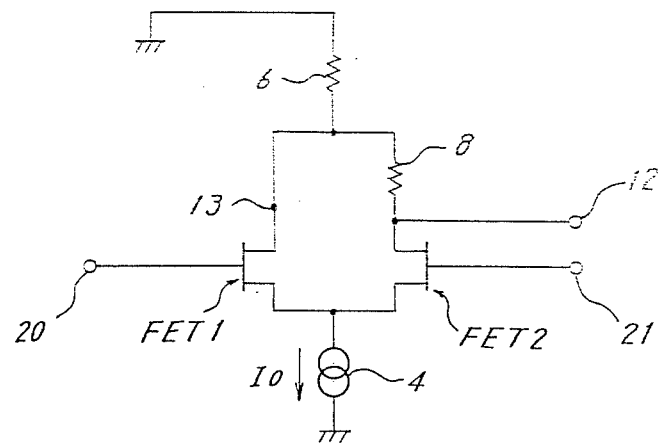

FIG. 3 illustrates a second specific example of conventional current switch. Where the input voltage $V_{IN}$ is a high negative value, this current switch is in a saturated state, so that the current $I_0$ flowing through the current switch will wholly flow through resistors 6 and 8 and an FET 2. The output voltage at this time, represented by $V_L$, is:

$$V_L = -I_0 (R_6 + R_8) \quad (3)$$

wherein $R_6$ and $R_8$ are the resistances of the resistors 6 and 8, respectively.

Meanwhile, where the input voltage $V_{IN}$ has a high positive value, the current switch is in a saturated state, so that the current $I_0$ flowing through the current switch will wholly flow through the resistor 6 and an FET 1. Thus, the output voltage $V_H$, which will drop in the resistor 6, will be:

$$V_H = -I_0 R_6 \quad (4)$$

Equation (4) shows that the output voltage $V_H$ can be set as desired by selecting an appropriate resistance $R_6$. It should be noted that the current switch in its active state operates similarly to the circuit illustrated in FIG. 1.

However, the first conventional current switch described above, since it allows the output voltage $V_H$ to be set only at an integral multiple of the voltage drop for a single diode, has little freedom of ouptut voltage $V_H$ setting, resulting in the disadvantage of making it difficult to set the output voltage $V_H$ at a desired level.

Meanwhile, the second conventional current switch, wherein the output voltage $V_H$ is determined by the resistance $R_6$ of the resistor 6 and the current $I_0$ flowing through the current switch, also has the disadvantage of allowing the output voltage $V_H$ to vary with the fluctuation of the current $I_0$. This problem is particularly conspicuous where FET's are implemented in a gallium arsenide (GaAs) integrated circuit. Hereinafter, the term "GaAs FET" is used as an FET implemented in a GaAs IC.

Figure 4:
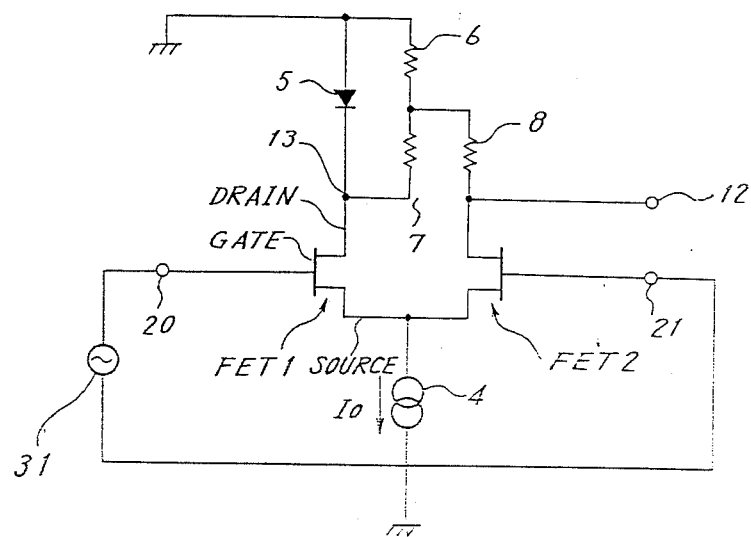
FIG. 4 is a circuit diagram illustrating a preferred embodiment of the invention.

FIG. 4 is a circuit diagram illustrating a preferred embodiment of the present invention. Referring to FIG. 4, a current switch according to the invention has a GaAs FET 1 having a gate electrode connected to an input terminal 20, a GaAs FET 2 having gate electrode connected to an input terminal 21, and a constant current source 4 of which one end is connected to the source electrodes of the FET's 1 and 2 and the other end is grounded. The current switch further comprises a diode 5 having the anode grounded and the cathode connected to the drain electrode of the FET 1, a resistor network and an output terminal 12 connected to the drain electrode of the FET 2. The resistor network comprises a resistor 6 of which one end is grounded, a resistor 7 connected between the other end of the resistor 6 and the drain electrode of the FET 1, a resistor 8 connected between the second end of the resistor 6 and the drain electrode of the FET 2.

Figure 5:
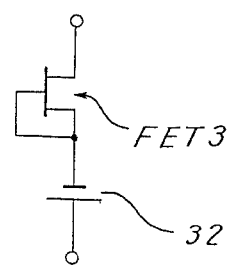
FIG. 5 is a circuit diagram illustrating an example of a constant current source.

FIG. 5 illustrates a specific example of the constant current source 4 shown in FIG. 4. The constant current source 4 comprises a constant current circuit using a power source 32 consisting of a GaAs FET 3. A current $I_0$ of the source 4 is represented by the following equation in terms of its relationship to the threshold $V_T$ of the FET 3:

$$I_0 32 \beta V_T 2 \tag{5}$$

where $\beta$ is a constant determined by the structure of the FET. Since the current $I_0$ is determined by the constants $\beta$ and $V_T$, which depend only on the structure of the FET, the current source 4 serves to supply a constant current irrespective of the operating state of the circuit.

Referring back to FIG. 4, when an input voltage $V_{IN}$ of a sufficiently high positive value is fed by the input signal source 31 to the input terminals 20 and 21, the FET 1 will be turned on and the FET 2, cut off. The current $I_0$ will wholly flow through the FET 1, and is further branched into the diode 5 and the resistors 6 and 7. The output voltage emerging at the output terminal 12 at this time, represented by $V_H$, will be:

$$V_H = -V_D R_6/(R_6+R_7) \tag{6}$$

wherein $V_D$ is the voltage at the two ends of the diode 5, and $R_6$ and $R_7$ are the resistances of the resistors 6 and 7, respectively.

Meanwhile, if an input voltage $V_{IN}$ of a sufficiently high negative value is supplied from the input signal source 31 to the input terminals 20 and 21, then the FET 2 will be turned on and the FET 1, cut off. The current $I_0$ flowing from the constant current source 4 will flow into the resistor 8 and the FET 2 via two routes, one consisting of the ground, the diode 5 and the resistor 7 and the other, of the ground and the resistor 6.

The output voltage at this time, represented by $V_L$, is:

$$V_L = V_D + I_0 R_8 + \frac{R_7 (I_0 R_6 - V_D)}{R_6 + R_7} \tag{7}$$

where $R_6$, $R_7$ and $R_8$ are the resistances of the resistors 6, 7 and 8, respectively. The current switch in its active state operates similarly to the current switch of the prior art illustrated in FIG. 1.

As is obvious from Equation (6), since the voltage $V_H$ is determined by the voltage $V_D$ at the two ends of the diode 5 in the present invention, it is sufficiently stabilized against the fluctuation of the current $I_0$. Further, the voltage $V_H$ can be determined as desired by appropriately setting the ratio between the resistances of the resistors 6 and 7.

As hitherto described, the present invention provides a current switch which can reduce the circuit current-dependence of the high level of the output and permits the high level of the output to be set as desired.

What is claimed is:

1. A current switch comprising: converting means having first and second input terminals and first and second output terminals and for converting the difference between input signals fed to said first and second input terminals into the difference between output signals from said first and second output terminals; a power source for supplying a constant current to said converting means; constant voltage means connected between a first output terminal of said converting means and said power source; a first resistor of which one end is connected to said power source; a second resistor of which one end is connected to the other end of said first resistor and the other end is connected to said first output terminal of said converting means; and a third resistor of which one end is connected to the other end of said first resistor and the other end is connected to a second output terminal of said converting means, wherein an output signal is taken out of said second output terminal.

2. A current switch, as claimed in claim 1, wherein said converting means includes two gallium arsenide FET's.

* * * * *